(12) United States Patent
Croswell et al.

(10) Patent No.: US 6,638,872 B1
(45) Date of Patent: Oct. 28, 2003

(54) INTEGRATION OF MONOCRYSTALLINE OXIDE DEVICES WITH FULLY DEPLETED CMOS ON NON-SILICON SUBSTRATES

(75) Inventors: Robert Croswell, Hanover Park, IL (US); Gregory Dunn, Arlington Heights, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/255,881

(22) Filed: Sep. 26, 2002

(51) Int. Cl.$^7$ .................. H01L 21/311; H01L 21/302; H01L 29/04; H01L 31/109
(52) U.S. Cl. ............. 438/695; 438/689; 257/63; 257/189
(58) Field of Search .............. 438/695, 689, 438/197, 458, 3; 257/63, 189, 190

(56) References Cited

U.S. PATENT DOCUMENTS

| | | | |
|---|---|---|---|
| 6,326,285 B1 | | 12/2001 | Behfar et al. |
| 6,328,796 B1 | | 12/2001 | Kub et al. |
| 6,344,404 B1 | | 2/2002 | Cheung et al. |
| 6,352,909 B1 | * | 3/2002 | Usenko ............ 438/458 |
| 6,355,541 B1 | | 3/2002 | Holland et al. |
| 6,387,829 B1 | | 5/2002 | Usenko et al. |
| 6,426,248 B2 | * | 7/2002 | Francis et al. ........... 438/197 |
| 6,489,241 B1 | * | 12/2002 | Thilderkvist et al. ....... 438/689 |
| 6,562,720 B2 | * | 5/2003 | Thilderkvist et al. ....... 438/695 |
| 2002/0022344 A1 | | 2/2002 | Kang et al. |
| 2002/0053318 A1 | | 5/2002 | Levy et al. |
| 2002/0056519 A1 | | 5/2002 | Henley et al. |

* cited by examiner

*Primary Examiner*—John F. Niebling
*Assistant Examiner*—Walter L. Lindsay, Jr.
(74) *Attorney, Agent, or Firm*—Cardinal Law Group (57) ABSTRACT

High quality epitaxial layers of monocrystalline materials can be grown overlying monocrystalline substrates such as large silicon wafers by forming a compliant substrate for growing the monocrystalline layers. An accommodating buffer layer comprises a layer of monocrystalline oxide spaced apart from a silicon wafer by an amorphous interface layer of silicon oxide. The amorphous interface layer dissipates strain and permits the growth of a high quality monocrystalline oxide accommodating buffer layer. Any lattice mismatch between the accommodating buffer layer and the underlying silicon substrate is taken care of by the amorphous interface layer. In addition, formation of a compliant substrate may include utilizing surfactant enhanced epitaxy and epitaxial growth of single crystal silicon onto single crystal oxide materials. Monocrystalline substrates having a hydrogen ion implant are cleaved along the hydrogen ion implant, and an insulating substrate is bonded to the monocrystalline oxide.

17 Claims, 7 Drawing Sheets

INTEGRATION OF MONOCRYSTALLINE OXIDE DEVICES WITH FULLY DEPLETED CMOS ON NON-SILICON SUBSTRATES

FIELD OF THE INVENTION

This invention relates generally to device structures and a method for their fabrication, and more specifically to semiconductor structures and devices and to the fabrication and use of semiconductor structures, devices, and integrated circuits.

BACKGROUND OF THE INVENTION

Semiconductor devices often include multiple layers of conductive, insulating, and semiconductive layers. Often, the desirable properties of such layers improve with the crystallinity of the layer. For example, the electron mobility and electron lifetime of semiconductive layers improve as the crystallinity of the layer increases. Similarly, the free electron concentration of conductive layers and the electron charge displacement and electron energy recoverability of insulative or dielectric films improve as the crystallinity of these layers increases.

For many years, attempts have been made to grow various monolithic thin films on a foreign substrate such as silicon (Si). To achieve optimal characteristics of the various monolithic layers, however, a monocrystalline film of high crystalline quality is desired. Attempts have been made, for example, to grow various monocrystalline layers on a substrate such as germanium, silicon, and various insulators. These attempts have generally been unsuccessful because lattice mismatches between the host crystal and the grown crystal have caused the resulting layer of monocrystalline material to be of low crystalline quality.

If a large area thin film of high quality monocrystalline material were available at low cost, a variety of semiconductor devices could advantageously be fabricated in or using that film at a low cost compared to the cost of fabricating such devices beginning with a bulk wafer of semiconductor material or in an epitaxial film of such material on a bulk wafer of semiconductor material. In addition, if a thin film of high quality monocrystalline material could be realized beginning with a bulk wafer such as a silicon wafer, an integrated device structure could be achieved that took advantage of the best properties of both the silicon and the high quality monocrystalline material.

Within the past couple of years, various inventive breakthroughs have addressed a need for a semiconductor structure that provides a high quality monocrystalline film or layer over another monocrystalline material and for a process for making such a structure. While these inventive breakthroughs offer significant advantages, it is also true that in many cases silicon is an undesirable substrate for the monocrystalline oxide device. For example, surface acoustic wave ("SAW") devices are preferably fabricated on diamond substrates because of diamond's high acoustic velocity, and tunable barium strontium titanate ("BST") and superconducting devices for radio frequency ("RF") applications are preferably fabricated on high quality insulating substrates like sapphire to reduce losses—even high resistivity silicon will introduce significant losses at RF frequencies. Accordingly, there is a need for a method of fabricating such monocrystalline oxide devices on non-silicon substrates, while at the same time preserving the epitaxial advantages of the silicon wafer, and the ability to integrate such devices with silicon devices. Moreover, it would be highly desirable to integrate monocrystalline oxide devices with silicon-on-insulator (SOI) devices that can operate in fully depleted mode.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
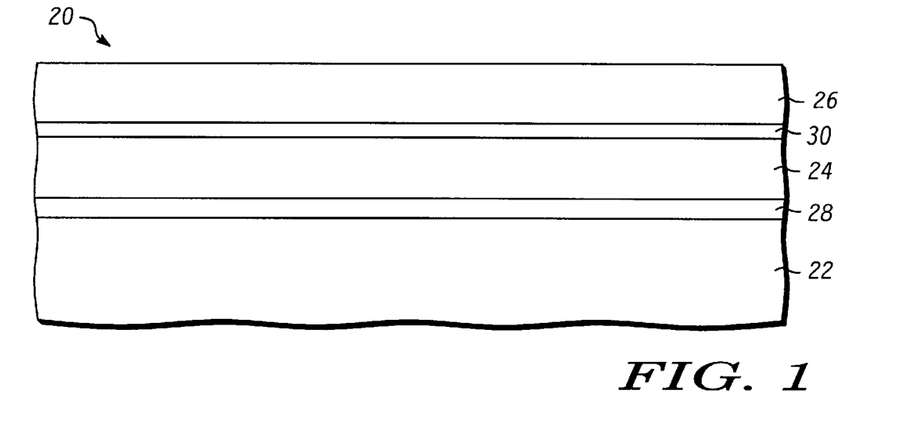
FIGS. 1, 2, and 3 illustrate schematically, in cross section, device structures in accordance with various embodiments of the invention.

FIG. 1 illustrates schematically, in cross section, a portion of a semiconductor structure 20 in accordance with an embodiment of the invention. Semiconductor structure 20 includes a monocrystalline substrate 22, accommodating buffer layer 24 comprising a monocrystalline material, and a monocrystalline material layer 26. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry.

In accordance with one embodiment of the invention, structure 20 also includes an amorphous intermediate layer 28 positioned between substrate 22 and accommodating buffer layer 24. Structure 20 may also include a template layer 30 between the accommodating buffer layer and monocrystalline material layer 26. As will be explained more fully below, the template layer helps to initiate the growth of the monocrystalline material layer on the accommodating buffer layer. The amorphous intermediate layer helps to relieve the strain in the accommodating buffer layer and by doing so, aids in the growth of a high crystalline quality accommodating buffer layer.

Substrate 22, in accordance with an embodiment of the invention, is a monocrystalline semiconductor or compound semiconductor wafer, preferably of large diameter. The wafer can be of, for example, a material from Group IV of the periodic table. Examples of Group IV semiconductor materials include silicon, germanium, mixed silicon and germanium, mixed silicon and carbon, mixed silicon, germanium and carbon, and the like. Preferably substrate 22 is a wafer containing silicon or germanium, and most preferably is a high quality monocrystalline silicon wafer as used in the semiconductor industry. Substrate 22 may also be, for example, SOI, where a thin layer of silicon is on top of an insulating material such as silicon oxide or glass. Accommodating buffer layer 24 is preferably a monocrystalline oxide or nitride material epitaxially grown on the underlying substrate. In accordance with one embodiment of the invention, amorphous intermediate layer 28 is grown on substrate 22 at the interface between substrate 22 and the growing accommodating buffer layer by the oxidation of substrate 22 during the growth of layer 24. The amorphous intermediate layer serves to relieve strain that might otherwise occur in the monocrystalline accommodating buffer layer as a result of differences in the lattice constants of the substrate and the buffer layer. As used herein, lattice constant refers to the distance between atoms of a cell measured in the plane of the surface. If such strain is not relieved by the amorphous intermediate layer, the strain may cause defects in the crystalline structure of the accommodating buffer layer. Defects in the crystalline structure of the accommodating buffer layer, in turn, would make it difficult to achieve a high quality crystalline structure in monocrystalline material layer 26 which may comprise a semiconductor material, a compound semiconductor material, or another type of material such as a metal or a non-metal.

Accommodating buffer layer 24 is preferably a monocrystalline oxide or nitride material selected for its crystalline compatibility with the underlying substrate and with the overlying material layer. For example, the material could be an oxide or nitride having a lattice structure closely matched to the substrate and to the subsequently applied monocrystalline material layer. Materials that are suitable for the accommodating buffer layer include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, and other perovskite oxide materials, and gadolinium oxide. Additionally, various nitrides such as gallium nitride, aluminum nitride, and boron nitride may also be used for the accommodating buffer layer. Most of these materials are insulators, although strontium ruthenate, for example, is a conductor. Generally, these materials are metal oxides or metal nitrides, and more particularly, these metal oxides or nitrides typically include at least two different metallic elements. In some specific applications, the metal oxides or nitrides may include three or more different metallic elements.

Amorphous interface layer 28 is preferably an oxide formed by the oxidation of the surface of substrate 22, and more preferably is composed of a silicon oxide. The thickness of layer 28 is sufficient to relieve strain attributed to mismatches between the lattice constants of substrate 22 and accommodating buffer layer 24. Typically, layer 28 has a thickness in the range of approximately 0.5–5 nm.

The material for monocrystalline material layer 26 can be selected, as desired, for a particular structure or application. For example, the monocrystalline material of layer 26 may comprise a compound semiconductor which can be selected, as needed for a particular semiconductor structure, from any of the Group IIIA and VA elements (III–V semiconductor compounds), mixed III–V compounds, Group II (A or B) and VIA elements (II–VI semiconductor compounds), mixed II–VI compounds, Group IV and VI elements (IV–VI semiconductor compounds), mixed IV–VI compounds, Group IV elements (Group IV semiconductors), and mixed Group IV compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), lead selenide (PbSe), lead telluride (PbTe), lead sulfide selenide (PbSSe), silicon (Si), germanium (Ge), silicon germanium (SiGe), silicon germanium carbide (SiGeC), and the like. However, monocrystalline material layer 26 may also comprise other semiconductor materials, metals, or non-metal materials which are used in the formation of semiconductor structures, devices and/or integrated circuits.

Appropriate materials for template 30 are discussed below. Suitable template materials chemically bond to the surface of the accommodating buffer layer 24 at selected sites and provide sites for the nucleation of the epitaxial growth of monocrystalline material layer 26. When used, template layer 30 has a thickness ranging from about 1 to about 10 monolayers.

Figure 2:
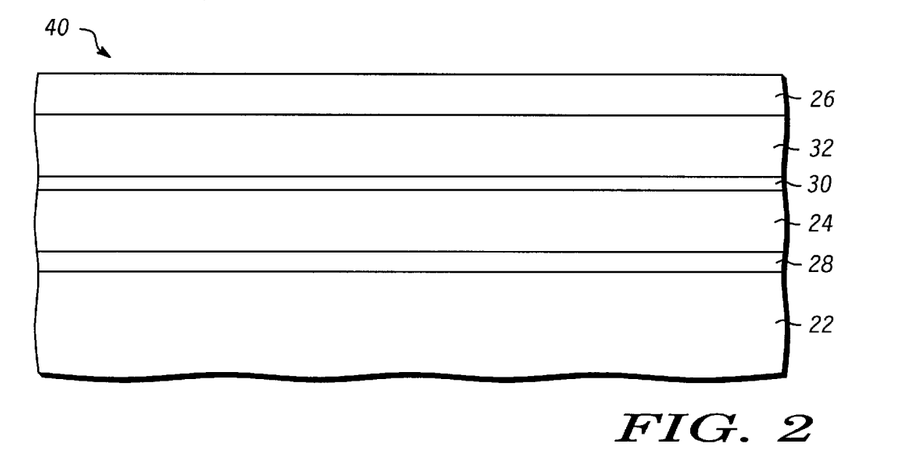

FIG. 2 illustrates, in cross section, a portion of a semiconductor structure 40 in accordance with a further embodiment of the invention. Structure 40 is similar to the previously described semiconductor structure 20, except that an additional buffer layer 32 is positioned between accommodating buffer layer 24 and monocrystalline material layer 26. Specifically, the additional buffer layer 32 is positioned between template layer 30 and the overlying layer of monocrystalline material. The additional buffer layer, formed of a semiconductor or compound semiconductor material when the monocrystalline material layer 26 comprises a semiconductor or compound semiconductor material, serves to provide a lattice compensation when the lattice constant of the accommodating buffer layer cannot be adequately matched to the overlying monocrystalline semiconductor or compound semiconductor material layer.

Figure 3:
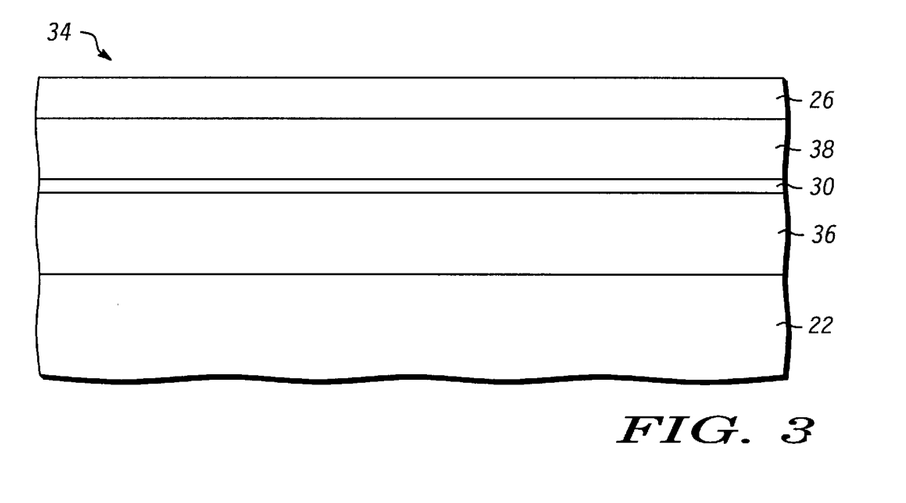

FIG. 3 schematically illustrates, in cross section, a portion of a semiconductor structure 34 in accordance with another exemplary embodiment of the invention. Structure 34 is similar to structure 20, except that structure 34 includes an amorphous layer 36, rather than accommodating buffer layer 24 and amorphous interface layer 28, and an additional monocrystalline layer 38.

As explained in greater detail below, amorphous layer 36 may be formed by first forming an accommodating buffer layer and an amorphous interface layer in a similar manner to that described above. Monocrystalline layer 38 is then formed (by epitaxial growth) overlying the monocrystalline accommodating buffer layer. The accommodating buffer layer may then be optionally exposed to an anneal process to convert at least a portion of the monocrystalline accommodating buffer layer to an amorphous layer. Amorphous layer 36 formed in this manner comprises materials from both the accommodating buffer and interface layers, which amorphous layers may or may not amalgamate. Thus, layer 36 may comprise one or two amorphous layers. Formation of amorphous layer 36 between substrate 22 and additional monocrystalline layer 26 (subsequent to layer 38 formation) relieves stresses between layers 22 and 38 and provides strain relief for subsequent processing—e.g., monocrystalline material layer 26 formation.

The processes previously described above in connection with FIGS. 1 and 2 are adequate for growing monocrystalline material layers over a monocrystalline substrate. However, the process described in connection with FIG. 3, which includes transforming at least a portion of a monocrystalline accommodating buffer layer to an amorphous oxide layer, may be better for growing monocrystalline material layers because it allows any strain in layer 26 to relax.

Additional monocrystalline layer 38 may include any of the materials described throughout this application in connection with either of monocrystalline material layer 26 or additional buffer layer 32. For example, when monocrystalline material layer 26 comprises a semiconductor or compound semiconductor material, layer 38 may include monocrystalline Group IV, monocrystalline compound semiconductor materials, or other monocrystalline materials including oxides and nitrides.

In accordance with one embodiment of the present invention, additional monocrystalline layer 38 serves as an anneal cap during layer 36 formation and as a template for subsequent monocrystalline layer 26 formation. Accordingly, layer 38 is preferably thick enough to provide a suitable template for layer 26 growth (at least one monolayer) and thin enough to allow layer 38 to form as a substantially defect free monocrystalline material.

In accordance with another embodiment of the invention, additional monocrystalline layer 38 comprises monocrystalline material (e.g., a material discussed above in connection with monocrystalline layer 26) that is thick enough to form devices within layer 38. In this case, a semiconductor structure in accordance with the present invention does not include monocrystalline material layer 26. In other words, the semiconductor structure in accordance with this embodiment only includes one monocrystalline layer disposed above amorphous oxide layer 36.

The following non-limiting, illustrative examples illustrate various combinations of materials useful in structures 20, 40, and 34 in accordance with various alternative embodiments of the invention. These examples are merely illustrative, and it is not intended that the invention be limited to these illustrative examples.

EXAMPLE 1

In accordance with one embodiment of the invention, monocrystalline substrate 22 is a silicon substrate typically (100) oriented. The silicon substrate can be, for example, a silicon substrate as is commonly used in making complementary metal oxide semiconductor (CMOS) integrated circuits having a diameter of about 200–300 mm. In accordance with this embodiment of the invention, accommodating buffer layer 24 is a monocrystalline layer of $Sr_zBa_{1-z}TiO_3$ where z ranges from 0 to 1 and the amorphous intermediate layer is a layer of silicon oxide ($SiO_x$) formed at the interface between the silicon substrate and the accommodating buffer layer. The value of z is selected to obtain one or more lattice constants closely matched to corresponding lattice constants of the subsequently formed layer 26. The lattice structure of the resulting crystalline oxide exhibits a substantially 45 degree rotation with respect to the substrate silicon lattice structure. The accommodating buffer layer can have a thickness of about 2 to about 100 nanometers (nm) and preferably has a thickness of about 5 nm. In general, it is desired to have an accommodating buffer layer thick enough to isolate the monocrystalline material layer 26 from the substrate to obtain the desired electrical and optical properties. Layers thicker than 100 nm usually provide little additional benefit while increasing cost unnecessarily; however, thicker layers may be fabricated if needed. The amorphous intermediate layer of silicon oxide can have a thickness of about 0.5–5 nm, and preferably a thickness of about 1 to 2 nm.

In accordance with this embodiment of the invention, monocrystalline material layer 26 is a compound semiconductor layer of gallium arsenide (GaAs) or aluminum gallium arsenide (AlGaAs) having a thickness of about 1 nm to about 100 micrometers ($\mu$m) and preferably a thickness of about 0.5 $\mu$m to 10 $\mu$m. The thickness generally depends on the application for which the layer is being prepared. To facilitate the epitaxial growth of the gallium arsenide or aluminum gallium arsenide on the monocrystalline oxide, a template layer is formed by depositing a surfactant layer comprising one element of the compound semiconductor layer to react with the surface of the oxide layer that has been previously capped. The capping layer is preferably up to 3 monolayers of Sr—O, Ti—O, strontium or titanium. The template layer is preferably of Sr—Ga, Ti—Ga, Ti—As, Ti—O—As, Ti—O—Ga, Sr—O—As, Sr—Ga—O, Sr—Al—O, or Sr—Al. The thickness of the template layer is preferably about 0.5 to about 10 monolayers, and preferably about 0.5–3 monolayers. By way of a preferred example 0.5–3 monolayers of Ga deposited on a capped Sr—O terminated surface have been illustrated to successfully grow GaAs layers. The resulting lattice structure of the compound semiconductor material exhibits a substantially 45 degree rotation with respect to the accommodating buffer layer lattice structure.

EXAMPLE 2

In accordance with a further embodiment of the invention, monocrystalline substrate 22 is a silicon substrate as described above. The accommodating buffer layer is a monocrystalline oxide of strontium or barium zirconate or hafnate in a cubic or orthorhombic phase with an amorphous intermediate layer of silicon oxide formed at the interface between the silicon substrate and the accommodating buffer layer. The accommodating buffer layer can have a thickness of about 2–100 nm and preferably has a thickness of at least 4 nm to ensure adequate crystalline and surface quality and is formed of monocrystalline $SrZrO_3$, $BaZrO_3$, $SrHfO_3$, $BaSnO_3$ or $BaHfO_3$. For example, a monocrystalline oxide layer of $BaZrO_3$ can grow at a temperature of about 700 degrees C. The lattice structure of the resulting crystalline oxide exhibits a substantially 45 degree rotation with respect to the substrate silicon lattice structure.

An accommodating buffer layer formed of these zirconate or hafnate materials is suitable for the growth of a monocrystalline material layer which comprises compound semiconductor materials in an indium phosphide (InP) system. In this system, the compound semiconductor material can be, for example, indium phosphide (InP), indium gallium arsenide (InGaAs), aluminum indium arsenide, (AlInAs), or aluminum gallium indium arsenic phosphide (AlGaInAsP), having a thickness of about 1.0 nm to 10 μm. A suitable template for this structure is about 0.5–10 monolayers of one of a material M—N and a material M—O—N, wherein M is selected from at least one of Zr, Hf, Ti, Sr, and Ba; and N is selected from at least one of As, P, Ga, Al, and In. Alternatively, the template may comprise 0.5–10 monolayers of gallium (Ga), aluminum (Al), indium (In), or a combination of gallium, aluminum or indium, zirconium-arsenic (Zr—As), zirconium-phosphorus (Zr—P), hafnium-arsenic (Hf—As), hafnium-phosphorus (Hf—P), strontium-oxygen-arsenic (Sr—O—As), strontium-oxygen-phosphorus (Sr—O—P), barium-oxygen-arsenic (Ba—O—As), indium-strontium-oxygen (In—Sr—O), or barium-oxygen-phosphorus (Ba—O—P), and preferably 0.5–2 monolayers of one of these materials. By way of an example, for a barium zirconate accommodating buffer layer, the surface is terminated with 0.5–2 monolayers of zirconium followed by deposition of 0.5–2 monolayers of arsenic to form a Zr—As template. A monocrystalline layer of the compound semiconductor material from the indium phosphide system is then grown on the template layer. The resulting lattice structure of the compound semiconductor material exhibits a substantially 45 degree rotation with respect to the accommodating buffer layer lattice structure and a lattice mismatch between the buffer layer and (100) oriented InP of less than 2.5%, and preferably less than about 1.0%.

EXAMPLE 3

In accordance with a further embodiment of the invention, a structure is provided that is suitable for the growth of an epitaxial film of a monocrystalline material comprising a II–VI material overlying a silicon substrate. The substrate is preferably a silicon wafer as described above. A suitable accommodating buffer layer material is $Sr_xBa_{1-x}TiO_3$, where x ranges from 0 to 1, having a thickness of about 2–100 nm and preferably a thickness of about 3–10 nm. The lattice structure of the resulting crystalline oxide exhibits a substantially 45 degree rotation with respect to the substrate silicon lattice structure. Where the monocrystalline layer comprises a compound semiconductor material, the II–VI compound semiconductor material can be, for example, zinc selenide (ZnSe) or zinc sulfur selenide (ZnSSe). A suitable template for this material system includes 0.5–10 monolayers of zinc-oxygen (Zn–O) followed by 0.5–2 monolayers of an excess of zinc followed by the selenidation of zinc on the surface. Alternatively, a template can be, for example, 0.5–10 monolayers of strontium-sulfur (Sr—S) followed by the ZnSSe.

EXAMPLE 4

This embodiment of the invention is an example of structure 40 illustrated in FIG. 2. Substrate 22, accommodating buffer layer 24, and monocrystalline material layer 26 can be similar to those described in example 1. In addition, an additional buffer layer 32 serves to alleviate any strains that might result from a mismatch of the crystal lattice of the accommodating buffer layer and the lattice of the monocrystalline material. Buffer layer 32 can be a layer of germanium or a GaAs, an aluminum gallium arsenide (AlGaAs), an indium gallium phosphide (InGaP), an aluminum gallium phosphide (AlGaP), an indium gallium arsenide (InGaAs), an aluminum indium phosphide (AlInP), a gallium arsenide phosphide (GaAsP), or an indium gallium phosphide (InGaP) strain compensated superlattice. In accordance with one aspect of this embodiment, buffer layer 32 includes a $GaAs_xP_{1-x}$ superlattice, wherein the value of x ranges from 0 to 1. In accordance with another aspect, buffer layer 32 includes an $In_yGa_{1-y}P$ superlattice, wherein the value of y ranges from 0 to 1. By varying the value of x or y, as the case may be, the lattice constant is varied from bottom to top across the superlattice to create a substantial (i.e., effective) match between lattice constants of the underlying oxide and the overlying monocrystalline material which in this example is a compound semiconductor material. The compositions of other compound semiconductor materials, such as those listed above, may also be similarly varied to manipulate the lattice constant of layer 32 in a like manner. The superlattice can have a thickness of about 50–500 nm and preferably has a thickness of about 100–200 nm. The superlattice period can have a thickness of about 2–15 nm, preferably 2–10 nm. The template for this structure can be the same as that described in example 1. Alternatively, buffer layer 32 can be a layer of monocrystalline germanium having a thickness of 1–50 nm and preferably having a thickness of about 2–20 nm. In using a germanium buffer layer, a template layer of either germanium-strontium (Ge—Sr) or germanium-titanium (Ge—Ti) having a thickness of about 0.5–2 monolayers can be used as a nucleating site for the subsequent growth of the monocrystalline material layer which in this example is a compound semiconductor material. The formation of the oxide layer is capped with either a 0.5–2 monolayer of strontium or a 0.5–2 monolayer of titanium to act as a nucleating site for the subsequent deposition of the monocrystalline germanium. The layer of strontium or titanium provides a nucleating site to which the first monolayer of germanium can bond.

EXAMPLE 5

This example also illustrates materials useful in a structure 40 as illustrated in FIG. 2. Substrate material 22, accommodating buffer layer 24, monocrystalline material layer 26 and template layer 30 can be the same as those described above in example 2. In addition, additional buffer layer 32 is inserted between the accommodating buffer layer and the overlying monocrystalline material layer. The buffer layer, a further monocrystalline material which in this instance comprises a semiconductor material, can be, for example, a graded layer of indium gallium arsenide (InGaAs) or indium aluminum arsenide (InAlAs). In accordance with one aspect of this embodiment, additional buffer layer 32 includes InGaAs, in which the indium composition varies from 0% at the monocrystalline material layer 26 to about 50% at the accommodating buffer layer 24. The additional buffer layer 32 preferably has a thickness of about 10–30 nm. Varying the composition of the buffer layer from GaAs to InGaAs serves to provide an effective (i.e. substantial) lattice match between the underlying monocrystalline oxide material and the overlying layer of monocrystalline material which in this example is a compound semiconductor material. Such a buffer layer is especially advantageous if there is a lattice mismatch between accommodating buffer layer 24 and monocrystalline material layer 26.

EXAMPLE 6

This example provides exemplary materials useful in structure 34, as illustrated in FIG. 3. Substrate material 22, template layer 30, and monocrystalline material layer 26 may be the same as those described above in connection with example 1.

Amorphous layer 36 is an amorphous oxide layer which is suitably formed of a combination of amorphous intermediate layer materials (e.g., layer 28 materials as described above) and accommodating buffer layer materials (e.g., layer 24 materials as described above). For example, amorphous layer 36 may include a combination of $SiO_x$ and $Sr_zBa_{1-z}TiO_3$ (where z ranges from 0 to 1), which combine or mix, at least partially, during an anneal process to form amorphous oxide layer 36.

The thickness of amorphous layer 36 may vary from application to application and may depend on such factors as desired insulating properties of layer 36, type of monocrystalline material comprising layer 26, and the like. In accordance with one exemplary aspect of the present embodiment, layer 36 thickness is about 1 nm to about 100 nm, preferably about 1–10 nm, and more preferably about 3–5 nm.

Layer 38 comprises a monocrystalline material that can be grown epitaxially over a monocrystalline oxide material such as material used to form accommodating buffer layer 24. In accordance with one embodiment of the invention, layer 38 includes the same materials as those comprising layer 26. For example, if layer 26 includes GaAs, layer 38 also includes GaAs. However, in accordance with other embodiments of the present invention, layer 38 may include materials different from those used to form layer 26. In accordance with one exemplary embodiment of the invention, layer 38 is about 1 nm to about 500 nm thick.

Referring again to FIGS. 1–3, substrate 22 is a monocrystalline substrate such as a monocrystalline silicon or gallium arsenide substrate. The crystalline structure of the monocrystalline substrate is characterized by a lattice constant and by a lattice orientation. In similar manner, accommodating buffer layer 24 is also a monocrystalline material and the lattice of that monocrystalline material is characterized by a lattice constant and a crystal orientation. The lattice constants of the accommodating buffer layer and the monocrystalline substrate must be closely matched or, alternatively, must be such that upon rotation of one crystal orientation with respect to the other crystal orientation, a substantial match in lattice constants is achieved. In this context the terms "substantially equal" and "substantially matched" mean that there is sufficient similarity between the lattice constants to permit the growth of a high quality crystalline layer on the underlying layer.

Figure 4:
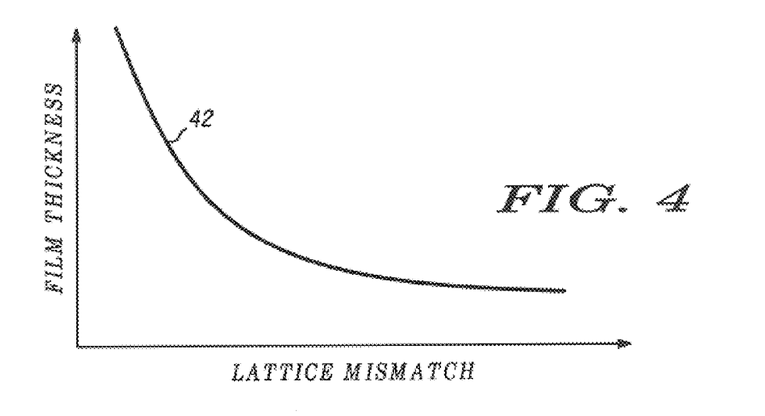
FIG. 4 illustrates graphically the relationship between maximum attainable film thickness and lattice mismatch between a host crystal and a grown crystalline overlayer.

FIG. 4 illustrates graphically the relationship of the achievable thickness of a grown crystal layer of high crystalline quality as a function of the mismatch between the lattice constants of the host crystal and the grown crystal. Curve 42 illustrates the boundary of high crystalline quality material. The area to the right of curve 42 represents layers that have a large number of defects. With no lattice mismatch, it is theoretically possible to grow an infinitely thick, high quality epitaxial layer on the host crystal. As the mismatch in lattice constants increases, the thickness of achievable, high quality crystalline layer decreases rapidly. As a reference point, for example, if the lattice constants between the host crystal and the grown layer are mismatched by more than about 2%, monocrystalline epitaxial layers in excess of about 20 nm cannot be achieved.

In accordance with one embodiment of the invention, substrate 22 is typically a (100) oriented monocrystalline silicon wafer and accommodating buffer layer 24 is a layer of strontium barium titanate. Substantial (i.e., effective) matching of lattice constants between these two materials is achieved by rotating the crystal orientation of the titanate material by approximately 45° with respect to the crystal orientation of the silicon substrate wafer. The inclusion in the structure of amorphous interface layer 28, a silicon oxide layer in this example, if it is of sufficient thickness, serves to reduce strain in the titanate monocrystalline layer that might result from any mismatch in the lattice constants of the host silicon wafer and the grown titanate layer. As a result, in accordance with an embodiment of the invention, a high quality, thick, monocrystalline titanate layer is achievable.

Still referring to FIGS. 1–3, layer 26 is a layer of epitaxially grown monocrystalline material and that crystalline material is also characterized by a crystal lattice constant and a crystal orientation. In accordance with one embodiment of the invention, the lattice constant of layer 26 differs from the lattice constant of substrate 22. To achieve high crystalline quality in this epitaxially grown monocrystalline layer, the accommodating buffer layer must be of high crystalline quality. In addition, in order to achieve high crystalline quality in layer 26, substantial matching between the crystal lattice constant of the host crystal, in this case, the monocrystalline accommodating buffer layer, and the grown crystal is desired. With properly selected materials this substantial matching of lattice constants is achieved as a result of rotation of the crystal orientation of the grown crystal with respect to the orientation of the host crystal. For example, if the grown crystal is gallium arsenide, aluminum gallium arsenide, zinc selenide, or zinc sulfur selenide and the accommodating buffer layer is monocrystalline $Sr_xBa_{1-x}TiO_3$, substantial matching of crystal lattice constants of the two materials is achieved, wherein the crystal orientation of the grown layer is rotated by substantially 45° with respect to the orientation of the host monocrystalline oxide. Similarly, if the host material is a strontium or barium zirconate or a strontium or barium hafnate or barium tin oxide and the compound semiconductor layer is indium phosphide or gallium indium arsenide or aluminum indium arsenide, substantial matching of crystal lattice constants can be achieved by rotating the orientation of the grown crystal layer by substantially 45° with respect to the host oxide crystal. In some instances, a crystalline semiconductor buffer layer 32 between the host oxide and the grown monocrystalline material layer 26 can be used to reduce strain in the grown monocrystalline material layer that might result from small differences in lattice constants. Better crystalline quality in the grown monocrystalline material layer can thereby be achieved.

The following example illustrates a process, in accordance with one embodiment of the invention, for fabricating a semiconductor structure such as the structures depicted in FIGS. 1–3. The process starts by providing a monocrystalline semiconductor substrate comprising silicon or germanium. In accordance with a preferred embodiment of the invention, the semiconductor substrate is a silicon wafer having a (100) orientation. The substrate is oriented on axis or, at most, about 6° off axis, and preferably misoriented 1–3° off axis toward the [110] direction. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process in accordance with the invention. In order to epitaxially grow a monocrystalline oxide layer overlying the monocrystalline substrate, the native oxide layer must first be removed to expose the crystalline structure of the underlying substrate. The following process is preferably carried out by molecular beam epitaxy (MBE), although other epitaxial processes may also be used in accordance with the present invention. The native oxide can be removed by first thermally depositing a thin layer (preferably 1–3 monolayers) of strontium, barium, a combination of strontium and barium, or other alkaline earth metals or combinations of alkaline earth metals in an MBE apparatus. In the case where strontium is used, the substrate is then heated to a temperature above 720° C. as measured by an optical pyrometer to cause the strontium to react with the native silicon oxide layer. The strontium serves to reduce the silicon oxide to leave a silicon oxide-free surface. The resultant surface may exhibit an ordered (2×1) structure. If an ordered (2×1) structure has not been achieved at this stage of the process, the structure may be exposed to additional strontium until an ordered (2×1) structure is obtained. The ordered (2×1) structure forms a template for the ordered growth of an overlying layer of a monocrystalline oxide. The template provides the necessary chemical and physical properties to nucleate the crystalline growth of an overlying layer.

It is understood that precise measurement of actual temperatures in MBE equipment, as well as other processing equipment, is difficult, and is commonly accomplished by the use of a pyrometer or by means of a thermocouple placed in close proximity to the substrate. Calibrations can be performed to correlate the pyrometer temperature reading to that of the thermocouple. However, neither temperature reading is necessarily a precise indication of actual substrate temperature. Furthermore, variations may exist when measuring temperatures from one MBE system to another MBE system. For the purpose of this description, typical pyrometer temperatures will be used, and it should be understood that variations may exist in practice due to these measurement difficulties.

In accordance with an alternate embodiment of the invention, the native silicon oxide can be converted and the substrate surface can be prepared for the growth of a monocrystalline oxide layer by depositing an alkaline earth metal oxide, such as strontium oxide, strontium barium oxide, or barium oxide, onto the substrate surface by MBE at a low temperature and by subsequently heating the structure to a temperature of above 720° C. At this temperature a solid state reaction takes place between the strontium oxide and the native silicon oxide causing the reduction of the native silicon oxide and leaving an ordered (2×1) structure on the substrate surface. If an ordered (2×1) structure has not been achieved at this stage of the process, the structure may be exposed to additional strontium until an ordered (2×1) structure is obtained. Again, this forms a template for the subsequent growth of an ordered monocrystalline oxide layer.

Following the removal of the silicon oxide from the surface of the substrate, in accordance with one embodiment of the invention, the substrate is cooled to a temperature in the range of about 200–600° C., preferably 350°–550° C., and a layer of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set at a minimum value to grow stoichiometric strontium titanate at a growth rate of about 0.1–0.8 nm per minute, preferably 0.3–0.5 nm per minute. After initiating growth of the strontium titanate, the partial pressure of oxygen is increased above the initial minimum value. The stoichiometry of the titanium can be controlled during growth by monitoring RHEED patterns and adjusting the titanium flux. The overpressure of oxygen causes the growth of an amorphous silicon oxide layer at the interface between the underlying substrate and the strontium titanate layer. This step may be applied either during or after the growth of the strontium titanate layer. The growth of the amorphous silicon oxide layer results from the diffusion of oxygen through the strontium titanate layer to the interface where the oxygen reacts with silicon at the surface of the underlying substrate. The strontium titanate grows as an ordered (100) monocrystal with the (100) crystalline orientation rotated by 45° with respect to the underlying substrate. Strain that otherwise might exist in the strontium titanate layer because of the small mismatch in lattice constant between the silicon substrate and the growing crystal is relieved in the amorphous silicon oxide intermediate layer.

After the strontium titanate layer has been grown to the desired thickness, the monocrystalline strontium titanate is capped by a template layer that is conducive to the subsequent growth of an epitaxial layer of a desired monocrystalline material. For example, for the subsequent growth of a monocrystalline compound semiconductor material layer of gallium arsenide, the MBE growth of the strontium titanate monocrystalline layer can be capped by terminating the growth with up to 2 monolayers of titanium, up to 2 monolayers of strontium, up to 2 monolayers of titanium-oxygen or with up to 2 monolayers of strontium-oxygen. Following the formation of this capping layer, arsenic is deposited to form a Ti—As bond, a Ti—O—As bond or a Sr—O—As bond. Any of these form an appropriate template for deposition and formation of a gallium arsenide monocrystalline layer. Following the formation of the template, gallium is subsequently introduced to the reaction with the arsenic and gallium arsenide forms. Alternatively, 0.5–3 monolayers of gallium can be deposited on the capping layer to form a Sr—O—Ga bond, or a Ti—O—Ga bond, and arsenic is subsequently introduced with the gallium to form the GaAs.

Figure 5:
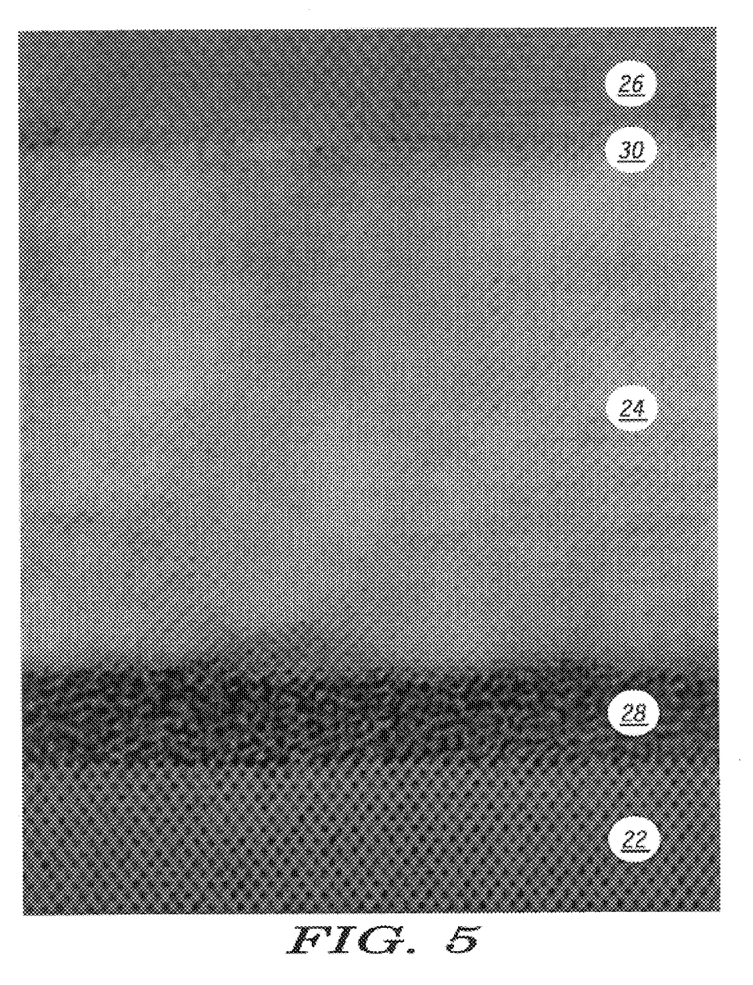
FIG. 5 illustrates a high resolution Transmission Electron Micrograph of a structure including a monocrystalline accommodating buffer layer.

FIG. 5 is a high resolution Transmission Electron Micrograph (TEM) of semiconductor material manufactured in accordance with one embodiment of the present invention. Single crystal $SrTiO_3$ accommodating buffer layer 24 was grown epitaxially on silicon substrate 22. During this growth process, amorphous interfacial layer 28 is formed, which relieves strain due to lattice mismatch. GaAs compound semiconductor layer 26 was then grown epitaxially using template layer 30.

Figure 6:
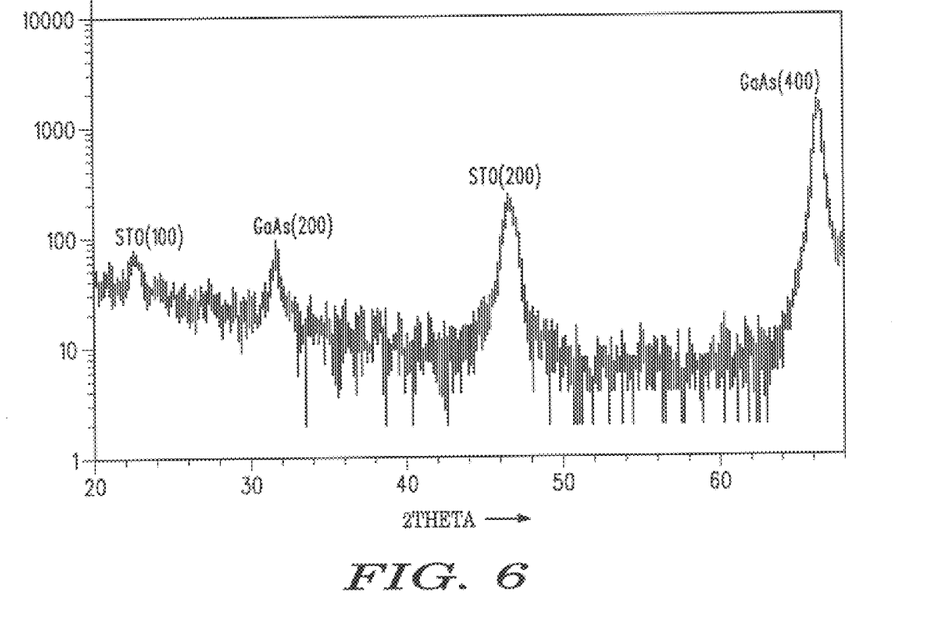
FIG. 6 illustrates an x-ray diffraction spectrum of a structure including a monocrystalline accommodating buffer layer.

FIG. 6 illustrates an x-ray diffraction spectrum taken on a structure including GaAs monocrystalline layer 26 comprising GaAs grown on silicon substrate 22 using accommodating buffer layer 24. The peaks in the spectrum indicate that both the accommodating buffer layer 24 and GaAs compound semiconductor layer 26 are single crystal and (100) oriented.

The structure illustrated in FIG. 2 can be formed by the process discussed above with the addition of an additional buffer layer deposition step. The additional buffer layer 32 is formed overlying the template layer 30 before the deposition of the monocrystalline material layer 26. If the additional buffer layer 32 is a monocrystalline material comprising a compound semiconductor superlattice, such a superlattice can be deposited, by MBE for example, on the template 30 described above. If instead, the additional buffer layer is a monocrystalline material layer comprising a layer of germanium, the process above is modified to cap the first buffer layer of strontium titanate with a final template layer of either strontium or titanium and then by depositing germanium to react with the strontium or titanium. The germanium buffer layer can then be deposited directly on this template.

Structure 34, illustrated in FIG. 3, may be formed by growing an accommodating buffer layer 24, forming an amorphous oxide layer 28 over substrate 22, and growing semiconductor layer 38 over the accommodating buffer layer, as described above. The accommodating buffer layer 24 and the amorphous oxide layer 28 are then exposed to a higher temperature anneal process sufficient to change the crystalline structure of the accommodating buffer layer from monocrystalline to amorphous, thereby forming an amorphous layer such that the combination of the amorphous oxide layer and the now amorphous accommodating buffer layer form a single amorphous oxide layer 36. Layer 26 is then subsequently grown over layer 38. Alternatively, the anneal process may be carried out subsequent to growth of layer 26.

In accordance with one aspect of this embodiment, layer 36 is formed by exposing substrate 22, the accommodating buffer layer 24, the amorphous oxide layer 28, and monocrystalline layer 38 to a rapid thermal anneal process with a peak temperature of about 700° C. to about 1000° C. (actual temperature) and a process time of about 5 seconds to about 20 minutes. However, other suitable anneal processes may be employed to convert the accommodating buffer layer to an amorphous layer in accordance with the present invention. For example, laser annealing, electron beam annealing, or "conventional" thermal annealing processes (in the proper environment) may be used to form layer 36. When conventional thermal annealing is employed to form layer 36, an overpressure of one or more constituents of layer 38 may be required to prevent degradation of layer 38 during the anneal process. For example, when layer 38 includes GaAs, the anneal environment preferably includes an overpressure of arsenic to mitigate degradation of layer 38. Alternately, an appropriate anneal cap, such as silicon nitride, may be utilized to prevent the degradation of layer 38 during the anneal process with the anneal cap being removed after the annealing process.

As noted above, layer 38 of structure 34 may include any materials suitable for either of layers 32 or 26. Accordingly, any deposition or growth methods described in connection with either layer 32 or 26 may be employed to deposit layer 38.

Figure 7:
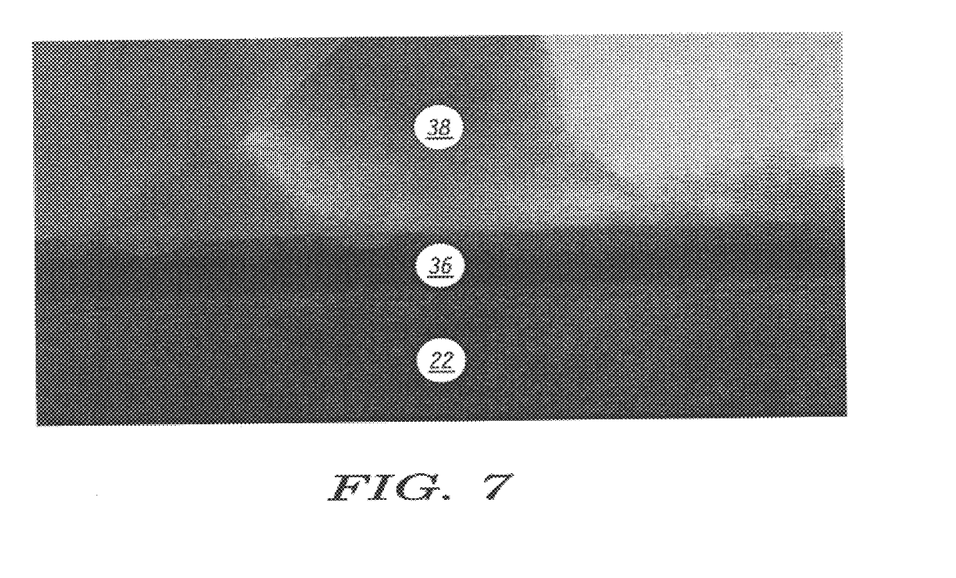
FIG. 7 illustrates a high resolution Transmission Electron Micrograph of a structure including an amorphous oxide layer.

FIG. 7 is a high resolution TEM of semiconductor material manufactured in accordance with the embodiment of the invention illustrated in FIG. 3. In accordance with this embodiment, a single crystal $SrTiO_3$ accommodating buffer layer was grown epitaxially on silicon substrate 22. During this growth process, an amorphous interfacial layer forms as described above. Next, additional monocrystalline layer 38 comprising a compound semiconductor layer of GaAs is formed above the accommodating buffer layer and the accommodating buffer layer is exposed to an anneal process to form amorphous oxide layer 36.

Figure 8:
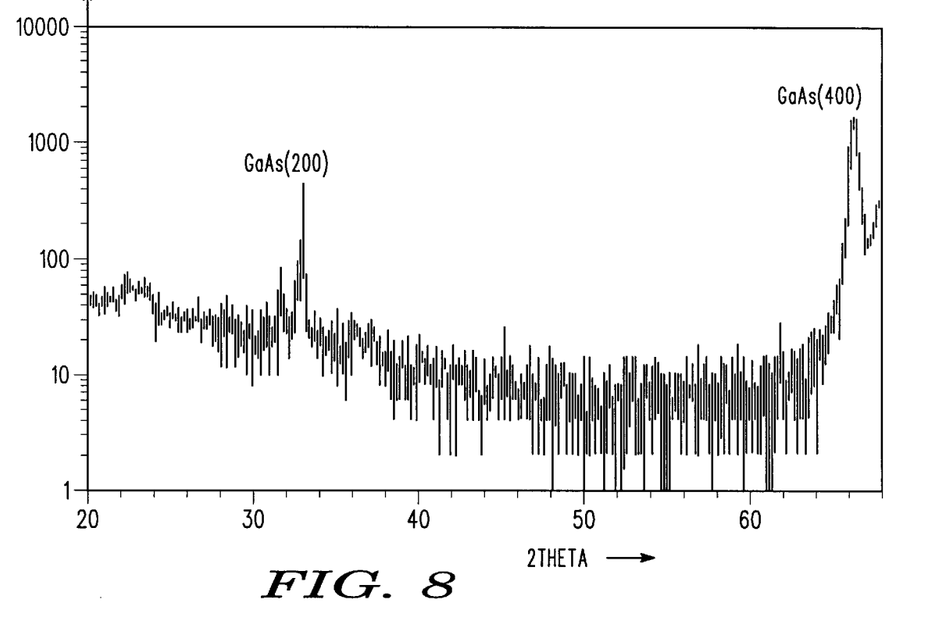
FIG. 8 illustrates an x-ray diffraction spectrum of a structure including an amorphous oxide layer.

FIG. 8 illustrates an x-ray diffraction spectrum taken on a structure including additional monocrystalline layer 38 comprising a GaAs compound semiconductor layer and amorphous oxide layer 36 formed on silicon substrate 22. The peaks in the spectrum indicate that GaAs compound semiconductor layer 38 is single crystal and (100) oriented and the lack of peaks around 40 to 50 degrees indicates that layer 36 is amorphous.

The process described above illustrates a process for forming a semiconductor structure including a silicon substrate, an overlying oxide layer, and a monocrystalline material layer comprising a gallium arsenide compound semiconductor layer by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like. Further, by a similar process, other monocrystalline accommodating buffer layers such as alkaline earth metal titanates, zirconates, hafnates, tantalates, vanadates, ruthenates, niobates, alkaline earth metal tin-based perovskites, lanthanum aluminate, lanthanum scandium oxide, and gadolinium oxide can also be grown. Further, by a similar process such as MBE, other monocrystalline material layers comprising other III–V, II–VI, and IV–VI monocrystalline compound semiconductors, semiconductors, metals and non-metals can be deposited overlying the monocrystalline oxide accommodating buffer layer.

Each of the variations of monocrystalline material layer and monocrystalline oxide accommodating buffer layer uses an appropriate template for initiating the growth of the monocrystalline material layer. For example, if the accommodating buffer layer is an alkaline earth metal zirconate, the oxide can be capped by a thin layer of zirconium. The deposition of zirconium can be followed by the deposition of arsenic or phosphorus to react with the zirconium as a precursor to depositing indium gallium arsenide, indium aluminum arsenide, or indium phosphide, respectively. Similarly, if the monocrystalline oxide accommodating buffer layer is an alkaline earth metal hafnate, the oxide layer can be capped by a thin layer of hafnium. The deposition of hafnium is followed by the deposition of arsenic or phosphorous to react with the hafnium as a precursor to the growth of an indium gallium arsenide, indium aluminum arsenide, or indium phosphide layer, respectively. In a similar manner, strontium titanate can be capped with a layer of strontium or strontium and oxygen, and barium titanate can be capped with a layer of barium or barium and oxygen. Each of these depositions can be followed by the deposition of arsenic or phosphorus to react with the capping material to form a template for the deposition of a monocrystalline material layer comprising compound semiconductors such as indium gallium arsenide, indium aluminum arsenide, or indium phosphide.

Single crystal silicon has 4-fold symmetry. That is, its structure is essentially the same as it is rotated in 90 degree steps in the plane of the (100) surface. Likewise, strontium titanate and many other oxides have a 4-fold symmetry. On the other hand, GaAs and related compound semiconductors have a 2-fold symmetry. The 0 degree and 180 degree rotations of the 2-fold symmetry are not the same as the 90 degree and 270 degree rotations of the 4-fold symmetry. If GaAs is nucleated upon strontium titanate at multiple locations on the surface, two different phases are produced. As the material continues to grow, the two phases meet and form anti-phase domains. These anti-phase domains can have an adverse effect upon certain types of devices, particularly minority carrier devices like lasers and light emitting diodes.

In accordance with one embodiment of the present invention, in order to provide for the formation of high quality monocrystalline compound semiconductor material, the starting substrate is off-cut or misoriented from the ideal (100) orientation by 0.5 to 6 degrees in any direction, and preferably 1 to 2 degrees toward the [110] direction. This offcut provides for steps or terraces on the silicon surface and it is believed that these substantially reduce the number of anti-phase domains in the compound semiconductor material, in comparison to a substrate having an offcut near 0 degrees or off cuts larger than 6 degrees. The greater the amount of off-cut, the closer the steps and the smaller the terrace widths become. At very small angles, nucleation occurs at other than the step edges, decreasing the size of single phase domains. At high angles, smaller terraces decrease the size of single phase domains. Growing a high quality oxide, such as strontium titanate, upon a silicon surface causes surface features to be replicated on the surface of the oxide. The step and terrace surface features are replicated on the surface of the oxide, thus preserving directional cues for subsequent growth of compound semiconductor material. Because the formation of the amorphous interface layer occurs after the nucleation of the oxide has begun, the formation of the amorphous interface layer does not disturb the step structure of the oxide.

After the growth of an appropriate accommodating buffer layer, such as strontium titanate or other materials as described earlier, a template layer is used to promote the proper nucleation of compound semiconductor material. In accordance with one embodiment, the strontium titanate is capped with up to 2 monolayers of SrO. The template layer 30 for the nucleation of GaAs is formed by raising the substrate to a temperature in the range of 540 to 630 degrees and exposing the surface to gallium. The amount of gallium exposure is preferably in the range of 0.5 to 5 monolayers. It is understood that the exposure to gallium does not imply that all of the material will actually adhere to the surface. Not wishing to be bound by theory, it is believed that the gallium atoms adhere more readily at the exposed step edges of the oxide surface. Thus, subsequent growth of gallium arsenide preferentially forms along the step edges and prefer an initial alignment in a direction parallel to the step edge, thus forming predominantly single domain material. Other materials besides gallium may also be utilized in a similar fashion, such as aluminum and indium or a combination thereof.

After the deposition of the template, a compound semiconductor material such as gallium arsenide may be deposited. The arsenic source shutter is preferably opened prior to opening the shutter of the gallium source. Small amounts of other elements may also be deposited simultaneously to aid nucleation of the compound semiconductor material layer. For example, aluminum may be deposited to form AlGaAs. As noted above, layer 38, illustrated in FIG. 3, comprises a monocrystalline material that can be grown epitaxially over a monocrystalline oxide material, such as material used to form accommodating buffer layer 24. In accordance with one embodiment of the invention, layer 38 includes materials different from those used to form layer 26. For example, in a preferred embodiment, layer 38 includes AlGaAs, which is deposited as a nucleation layer at a relatively slow growth rate. For example, the growth rate of layer 38 of AlGaAs can be approximately 0.10–0.5 µm/hr. In this case, growth can be initiated by first depositing As on template layer 30, followed by deposition of aluminium and gallium. Deposition of the nucleation layer generally is accomplished at about 300–600° C., and preferably 400–500° C. In accordance with one exemplary embodiment of the invention, the nucleation layer is about 1 nm to about 500 nm thick, and preferably 5 nm to about 50 nm. In this case, the aluminum source shutter is preferably opened prior to opening the gallium source shutter. The amount of aluminum is preferably in the range from 0 to 50% (expressed as a percentage of the aluminum contentin the AlGaAs layer), and is most preferably about 15–25%. Other materials, such as InGaAs, could also be used in a similar fashion. Once the growth of compound semiconductor material is initiated, other mixtures of compound semiconductor materials can be grown with various compositions and various thicknesses as required for various applications. For example, a thicker layer of GaAs may be grown on top of the AlGaAs layer to provide a semi-insulating buffer layer prior to the formation of device layers.

The quality of the compound semiconductor material can be improved by including one or more in-situ anneals at various points during the growth. The growth is interrupted, and the substrate is raised to a temperature of between 500°–650° C., and preferably about 550°–600° C. The anneal time depends on the temperature selected, but for an anneal of about 550° C., the length of time is preferably about 15 minutes. The anneal can be performed at any point during the deposition of the compound semiconductor material, but preferably is performed when there is 50 nm to 500 nm of compound semiconductor material deposited. Additional anneals may also be done, depending on the total thickness of material being deposited.

In accordance with one embodiment, monocrystalline material layer 26 is GaAs. Layer 26 may be deposited on layer 24 at various rates, which may vary from application to application; however in a preferred embodiment, the growth rate of layer 26 is about 0.2 to 1.0 µm/hr. The temperature at which layer 26 is grown may also vary, but in one embodiment, layer 26 is grown at a temperature of about 300°–600° C. and preferably about 350°–500° C.

Turning now to FIGS. 9–12, the formation of a device structure in accordance with still another embodiment of the invention is illustrated in cross-section. This embodiment utilizes the formation of a compliant substrate which relies on the epitaxial growth of single crystal oxides on silicon followed by the epitaxial growth of single crystal silicon onto the oxide.

Figure 9:
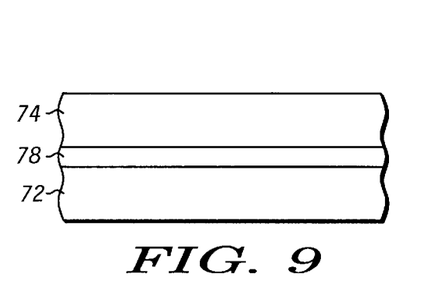
FIGS. 9–12 illustrate schematically, in cross-section, the formation of a device structure in accordance with another embodiment of the invention.

An accommodating buffer layer 74 such as a monocrystalline oxide layer is first grown on a substrate layer 72, such as silicon, with an amorphous interface layer 78 as illustrated in FIG. 9. Monocrystalline oxide layer 74 may be comprised of any of those materials previously discussed with reference to layer 24 in FIGS. 1 and 2, while amorphous interface layer 78 is preferably comprised of any of those materials previously described with reference to the layer 28 illustrated in FIGS. 1 and 2. Substrate 72, although preferably silicon, may also comprise any of those materials previously described with reference to substrate 22 in FIGS. 1–3.

Figure 10:
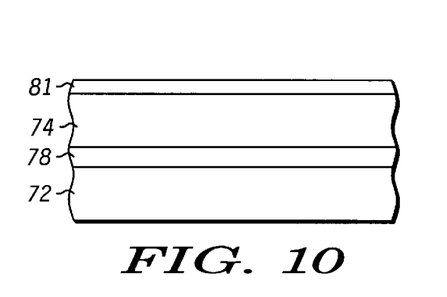

Next, a silicon layer 81 is deposited over monocrystalline oxide layer 74 via MBE, CVD, MOCVD, MEE, ALE, PVD, CSD, PLD, or the like as illustrated in FIG. 10 with a thickness of a few tens of nanometers but preferably with a thickness of about 5 nm. Monocrystalline oxide layer 74 preferably has a thickness of about 2 to 10 nm.

Figure 11:
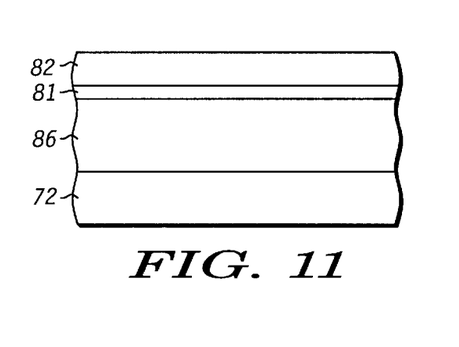

Rapid thermal annealing is then conducted in the presence of a carbon source such as acetylene or methane, for example at a temperature within a range of about 800° C. to 1000° C. to form capping layer 82 and silicate amorphous layer 86. However, other suitable carbon sources may be used as long as the rapid thermal annealing step functions to amorphize the monocrystalline oxide layer 74 into a silicate amorphous layer 86 and carbonize the top silicon layer 81 to form capping layer 82 which in this example would be a silicon carbide (SiC) layer as illustrated in FIG. 11. The formation of amorphous layer 86 is similar to the formation of layer 36 illustrated in FIG. 3 and may comprise any of those materials described with reference to layer 36 in FIG. 3 but the preferable material will be dependent upon the capping layer 82 used for silicon layer 81.

Figure 12:
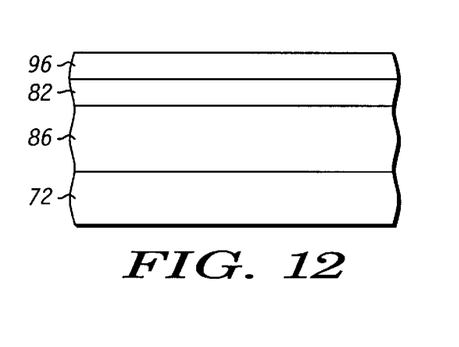

Finally, as shown in FIG. 12, a compound semiconductor layer 96, such as gallium nitride (GaN), is grown over the SiC surface by way of MBE, CVD, MOCVD, MEE, ALE, PVD, CSD, PLD, or the like to form a high quality compound semiconductor material for device formation. More specifically, the deposition of GaN and GaN based systems such as GaInN and AlGaN will result in the formation of dislocation nets confined at the silicon/amorphous region. The resulting nitride containing compound semiconductor material may comprise elements from groups III, IV and V of the periodic table and is defect free. Although GaN has been grown on SiC substrate in the past, this embodiment of the invention possesses a one step formation of the compliant substrate containing a SiC top surface and an amorphous layer on a Si surface. More specifically, this embodiment of the invention uses an intermediate single crystal oxide layer that is amorphized to form a silicate layer which adsorbs the strain between the layers. Moreover, unlike past use of a SiC substrate, this embodiment of the invention is not limited by wafer size which is usually less than 50 mm in diameter for prior art SiC substrates.

The monolithic integration of nitride containing semiconductor compounds containing group III-V nitrides and silicon devices can be used for high temperature and high power RF applications and optoelectronics. GaN systems have particular use in the photonic industry for the blue/green and UV light sources and detection. High brightness light emitting diodes (LEDs) and lasers may also be formed within the GaN system.

Clearly, those embodiments specifically describing structures having compound semiconductor portions and Group IV semiconductor portions are meant to illustrate embodiments of the present invention and not limit the present invention. There are a multiplicity of other combinations and other embodiments of the present invention. For example, the present invention includes structures and methods for fabricating material layers which form semiconductor structures, devices and integrated circuits including other layers such as metal and non-metal layers. More specifically, the invention includes structures and methods for forming a compliant substrate which is used in the fabrication of semiconductor structures, devices and integrated circuits and the material layers suitable for fabricating those structures, devices, and integrated circuits. By using embodiments of the present invention, it is now simpler to integrate devices that include monocrystalline layers comprising semiconductor and compound semiconductor materials, as well as other material layers that are used to form those devices, with other components that work better or are easily and/or inexpensively formed within semiconductor or compound semiconductor materials. This allows a device to be shrunk, the manufacturing costs to decrease, and yield and reliability to increase.

In accordance with one embodiment of this invention, a monocrystalline semiconductor or compound semiconductor wafer can be used in forming monocrystalline material layers over the wafer. In this manner, the wafer is essentially a "handle" wafer used during the fabrication of semiconductor electrical components within a monocrystalline layer overlying the wafer. Therefore, electrical components can be formed within semiconductor materials over a wafer of at least approximately 200 millimeters in diameter and possibly at least approximately 300 millimeters.

By the use of this type of substrate, the relatively inexpensive "handle" wafer overcomes the fragile nature of wafers fabricated of monocrystaline compound semiconductor or other monocrystalline material by placing the materials over a relatively more durable and easy to fabricate base substrate. Therefore, an integrated circuit can be formed such that all electrical components, and particularly all active electronic devices, can be formed within or using the monocrystalline material layer even though the substrate itself may include a different monocrystalline semiconductor material. Fabrication costs for compound semiconductor devices and other devices employing non-silicon monocrystalline materials should decrease because larger substrates can be processed more economically and more readily compared to the relatively smaller and more fragile substrates (e.g., conventional compound semiconductor wafers).

Figure 13:
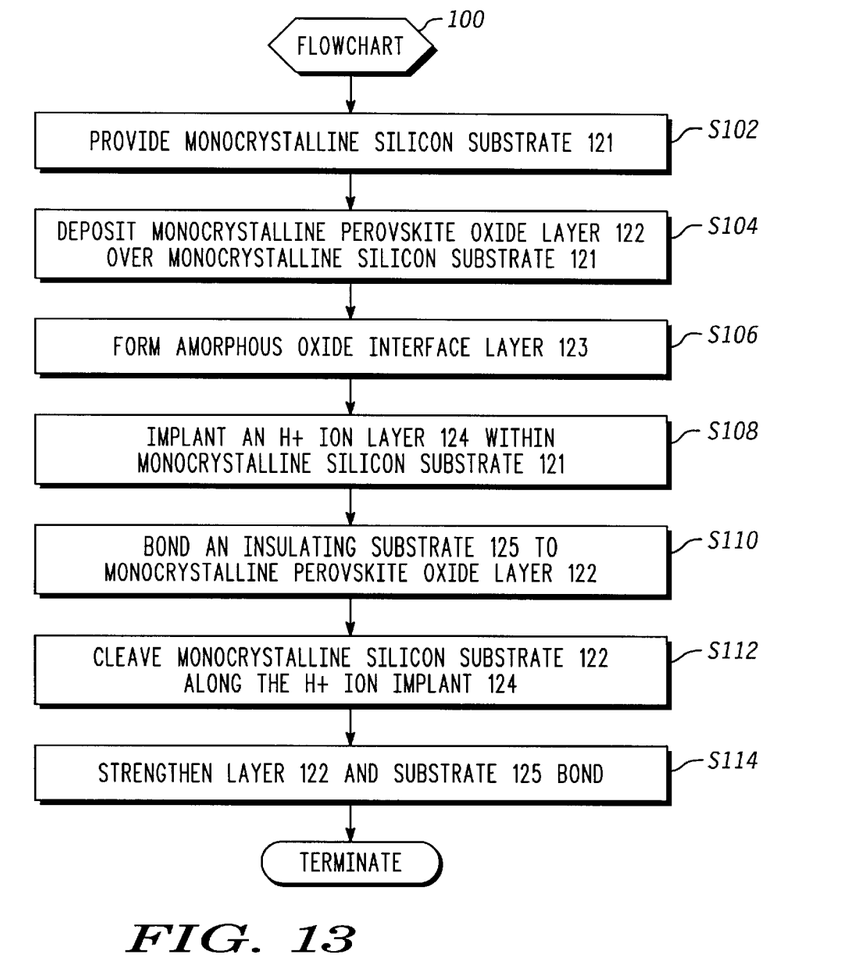
FIG. 13 illustrates a flowchart representative of a silicon wafer cleaving method in accordance with the present invention.
Figure 14:
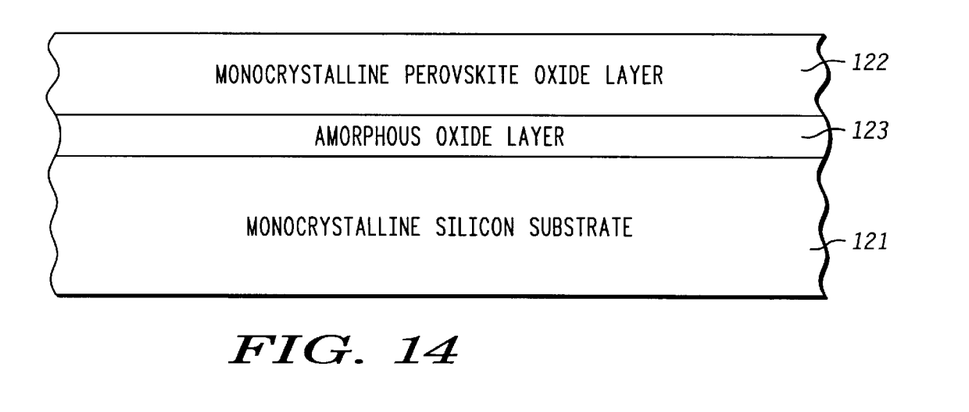
FIGS. 14–16 illustrate schematically, in cross-section, the formation of a structure in accordance with the FIG. 13 flowchart.

FIG. 13 illustrates a flowchart 100 representative of a silicon cleaving method of the present invention for fabricating a structure 120 (FIG. 16) in accordance with still another embodiment of the present invention. During a fabrication stage S102 of the flowchart 100, a monocrystalline silicon substrate 121 is provided as illustrated in FIG. 14. Substrate 121, although preferably silicon, may also comprise any of those materials previously described with reference to substrate 22 in FIGS. 1–3.

During a fabrication stage S104 of the flowchart 100, an accommodating buffer layer in the form of a monocrystalline perovskite oxide layer 122 is deposited on the monocrystalline silicon substrate 121 as illustrated in FIG. 14 in accordance with previous teachings herein. In one embodiment, the monocrystalline perovskite oxide layer 122 may be comprised of any of those materials previously discussed with reference to layer 24 in FIGS. 1 and 2. In an alternative embodiment, the monocrystalline perovskite oxide layer 122 may be comprised of a plurality of layers of perovskite oxides of different compositions. An exemplary embodiment of monocrystalline perovskite oxide layer 122 suitable for tunable capacitors includes a first layer of STO and a second layer of BST overlying the STO. An exemplary embodiment of monocrystalline perovskite oxide layer 122 suitable for SAWs and BAWs includes a first layer of STO and a second layer of lead zirconate titanate ("PZT") overlying the STO.

During a fabrication stage S106 of the flowchart 100, an amorphous oxide layer 123 is formed between the monocrystalline silicon substrate 121 and the monocrystalline perovskite oxide layer 122 as illustrated in FIG. 14 in accordance with the previous teachings.

Figure 15:
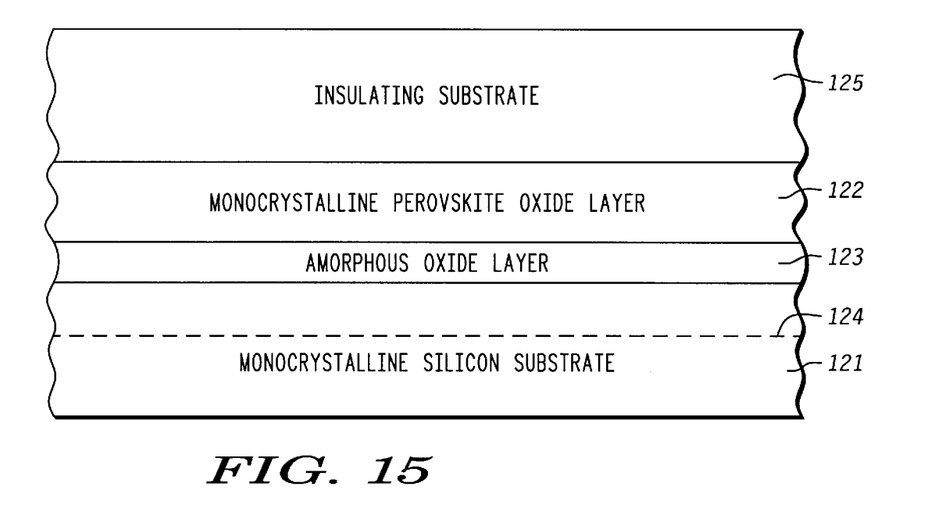

During a fabrication stage S108 of the flowchart 100, a hydrogen ion ("H+") layer 124 is conventionally implanted within the monocrystalline silicon substrate 121 as illustrated in FIG. 15. In an alternative embodiment of the flowchart 100, fabrication stage S108 is omitted and the H+ ion implant 124 is conventionally implanted within the monocrystalline silicon substrate 121 during fabrication stage S102.

During a fabrication stage S110 of the flowchart 100, an insulating substrate 125 is conventionally bonded to the monocrystalline perovskite oxide layer 122 as illustrated in FIG. 15. The insulating substrate 125 is composed of any material having insulation properties, such as, for example, sapphire, diamond, alumina, or aluminum nitride. In one embodiment, a conventional room temperature hydrophilic bonding process is implemented during fabrication stage S110.

Figure 16:
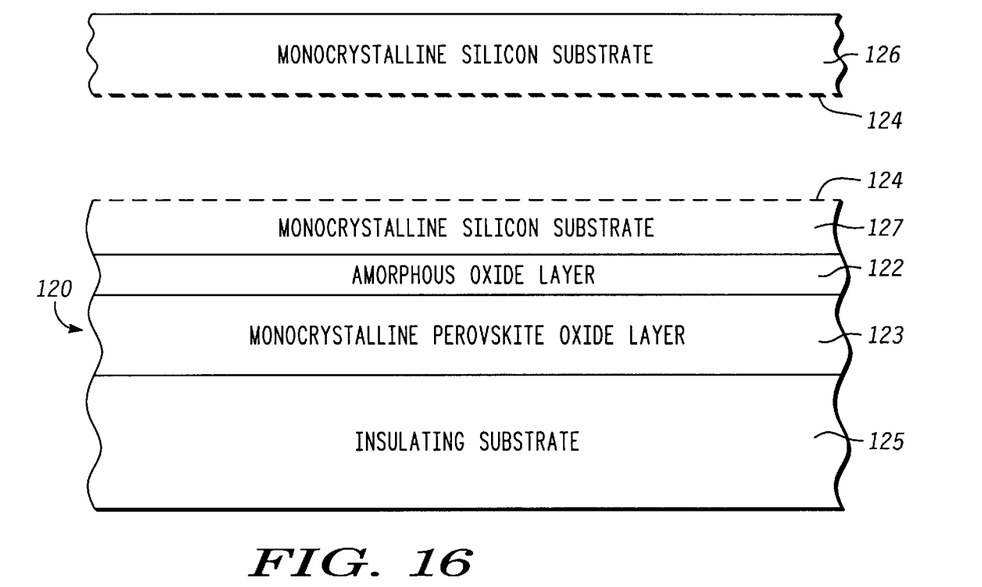

During a fabrication stage S112 of the flowchart 100, the monocrystalline silicon substrate 121 is cleaved along the H+ ion implant 124 whereby a monocrystalline silicon substrate 126 and a monocrystalline silicon substrate 127 are formed as illustrated in FIG. 16. In one embodiment, the monocrystalline silicon substrate 121 is heated to about 500° C. whereby the monocrystalline silicon substrate 121 cleaves along the along the H+ ion implant 124 to thereby form the monocrystalline silicon substrate 126 and the monocrystalline silicon substrate 127. The monocrystalline silicon substrate 126 is discarded or reserved for future reuse. The monocrystalline silicon substrate 127 has an initial surface roughness less than 100 Å RMS that can be improved to less than 1.5 Å RMS with a conventional technique, such as, for example touch CMP. The monocrystalline silicon substrate 127 is preferably 10 nm–1000 nm thick.

During a final fabrication stage S114 of the flowchart 100, the bonding of the monocrystalline perovskite oxide layer 122 and the insulating substrate 125 is conventionally annealed at a suitable high temperature in an oxidizing ambient to thereby strengthen the bond.

Figure 17:
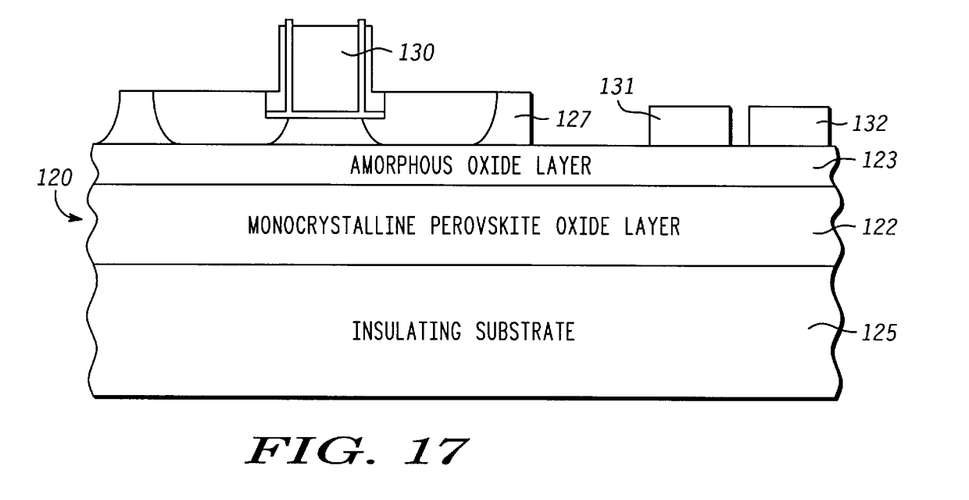
FIG. 17 illustrates schematically, in cross-section, the formation of various devices on the FIG. 16 structure.

Upon completion of the flowchart 100, the structure 120 as illustrated in FIG. 16 includes the monocrystalline silicon substrate 127 overlying the amorphous oxide layer 123, which overlies the monocrystalline perovskite oxide layer 122, which overlies the insulating substrate 125. The structure 120 can thereafter be used for a conventional fabrication of devices such as a fully depleted CMOS device 130 within the monocrystalline silicon substrate 127 as illustrated in FIG. 17. Furthermore, the structure 120 can thereafter be used for a conventional fabrication of many monocrystalline oxide RF devices including SAWs, bulk acoustic wave ("BAW") resonators, tunable capacitors, and tunable microwave components on the monocrystalline perovskite oxide layer 122, such as, for example, a tunable capacitor (not shown) having a pair of electrodes 131 and 132 illustrated in FIG. 17. In one embodiment, a portion of the monocrystalline silicon substrate 127 can be conventionally removed prior to fabrication stage S114 (FIG. 13) to thereby expose a portion of the monocrystalline perovskite oxide layer 122 to minimize, if not prevent, oxygen depletion of the monocrystalline perovskite oxide layer 122 during fabrication stage S114.

Although various values and ranges have been provided for thickness and roughness of the silicon substrate, one skilled in the art will realize that these ranges are merely example ranges and values, and other values and ranges may be utilized in conjunction with the silicon substrate discussed herein without deviating from the invention.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A structure (120), comprising:

an insulating substrate (125);

a monocrystalline perovskite oxide material (122) overlying said insulating substrate (125);

an amorphous oxide material (123) overlying said monocrystalline perovskite oxide material (122); and a monocrystalline silicon substrate (127) overlying said amorphous oxide material (122),
      wherein a thickness of said monocrystalline silicon substrate (127) is defined by a hydrogen implant (124).

2. The structure (120) of claim 1, further comprising:

an electronic device operatively supported by said monocrystalline silicon substrate (127).

3. The structure (120) of claim 2, wherein said electronic device is fully depleted.

4. The structure (120) of claim 1, further comprising:

an electronic device operatively supported by said monocrystalline perovskite oxide material (122).

5. The structure (120) of claim 4, wherein said electronic device is a monocrystalline oxide device.

6. The structure (120) of claim 1, wherein said monocrystalline perovskite oxide material (122) includes a plurality of layers, each layer having a different material composition.

7. A structure (120), comprising:

an insulating substrate (125);

a monocrystalline perovskite oxide material (122) overlying said insulating substrate (125);

an amorphous oxide material (123) overlying said monocrystalline perovskite oxide material (122); and a first monocrystalline silicon substrate (127) overlying said amorphous oxide material (122),
      wherein said first monocrystalline silicon substrate (127) is cleaved from a second monocrystalline silicon substrate (121) along a hydrogen implant (124) within the second monocrystalline silicon substrate (121).

8. The structure (120) of claim 7, further comprising:

an electronic device operatively supported by said monocrystalline silicon substrate (127).

9. The structure (120) of claim 8, wherein said electronic device is fully depleted.

10. The structure (120) of claim 8, further comprising:

an electronic device operatively supported by said monocrystalline perovskite oxide material (122).

11. The structure (120) of claim 10, wherein said electronic device is a monocrystalline oxide device.

12. The structure (120) of claim 7, wherein said monocrystalline perovskite oxide material (122) includes a plurality of layers, each layer having a different material composition.

13. A process for fabricating a semiconductor structure (120), said process comprising:

provi​ding a monocrystalline silicon substrate (121);

depositing a monocrystalline perovskite oxide film (122) overlying the monocrystalline silicon substrate (121);

forming an amorphous oxide interface layer (123) at an interface between the monocrystalline perovskite oxide film (122) and the monocrystalline silicon substrate (121); and implanting a hydrogen ion layer (124) within the monocrystalline silicon substrate (121).

14. The process of claim 13, further comprising:

cleaving the monocrystalline silicon substrate (121) along the hydrogen ion layer (124).

15. The process of claim 13, further comprising:

bonding an insulating substrate (125) to the monocrystalline perovskite oxide layer (122).

16. The process of claim 13, further comprising:

forming an electronic device overlying the monocrystalline perovskite oxide layer (122).

17. The process of claim 13, further comprising:

forming an electronic device on or within a portion (127) of the monocrystalline silicon substrate (121) subsequent to the cleaving of the monocrystalline silicon substrate (121) along the hydrogen ion layer (124).

\* \* \* \* \*